(12) United States Patent
Wu (10) Patent No.: US 11,229,130 B2
(45) Date of Patent: Jan. 18, 2022

(54) HEAT-INSULATION DEVICE AND ELECTRONIC PRODUCT

(71) Applicant: ZTE Corporation, Shenzhen (CN)

(72) Inventor: Dianfeng Wu, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 16/968,565

(22) PCT Filed: Feb. 1, 2019

(86) PCT No.: PCT/CN2019/074361
§ 371 (c)(1),
(2) Date: Aug. 7, 2020

(87) PCT Pub. No.: WO2019/154307
PCT Pub. Date: Aug. 15, 2019

(65) Prior Publication Data
US 2021/0045257 A1    Feb. 11, 2021

(30) Foreign Application Priority Data
Feb. 9, 2018    (CN) .......................... 201810136695.4

(51) Int. Cl.
*H05K 5/02* (2006.01)
*H05K 5/06* (2006.01)
(52) U.S. Cl.
CPC ........... *H05K 5/0213* (2013.01); *H05K 5/069* (2013.01)
(58) Field of Classification Search
CPC . H01L 23/427; H01L 23/433; H01L 23/4093; H01L 23/36; H01L 23/367; H01L 23/3672; H01L 23/3675; H01L 23/3736; H05K 7/20254; H05K 7/20336; H05K 1/0204; H05K 1/0209; H05K 1/021;
(Continued)

(56) References Cited

U.S. PATENT DOCUMENTS

| 6,021,046 A | 2/2000 | McLellan et al. |
| 8,230,907 B2 * | 7/2012 | Thayer ................ F28D 15/0241 |
| | | 165/104.26 |

(Continued)

FOREIGN PATENT DOCUMENTS

| CN | 102036537 A | 4/2011 |
| CN | 102594289 A | 7/2012 |

(Continued)

OTHER PUBLICATIONS

Examination Report No. 1 for Australia Application No. 2019218311, dated Apr. 7, 2021, 5 pages.

(Continued)

*Primary Examiner* — Michael A Matey
(74) *Attorney, Agent, or Firm* — Eversheds Sutherland (US) LLP (57) ABSTRACT

A heat-insulation device and an electronic product, the heat-insulation device is of a closed hollow structure, and includes a first cover body and a second cover body arranged opposite to each other; a vacuum cavity is formed in the heat-insulation device; the first cover body is made of a heat-conducting material; and a heat-conducting element is provided in the vacuum cavity, and a first end of the heat-conducting element is in contact with an inner wall surface of the first cover body.

19 Claims, 5 Drawing Sheets

(58) Field of Classification Search
CPC ... H05K 2201/062; H05K 2201/09063; H05K 2201/10219; H05K 7/20; H05K 7/209; H05K 5/0213; H05K 5/069; F28D 15/0233; F28D 15/0283; F28D 15/0275; F28D 2015/0291; F28F 2215/02; F28F 2215/06; F28F 2215/10; F28F 2215/14; F28F 2215/04; F28F 2210/04; F28F 2210/06; F28F 2210/10
See application file for complete search history.

(56) References Cited

U.S. PATENT DOCUMENTS

| | | | |
|---|---|---|---|
| 8,673,471 B2 | 3/2014 | Yokoyama et al. | |
| 8,953,314 B1* | 2/2015 | Fedorov | H01L 23/473 361/689 |
| 9,661,745 B1* | 5/2017 | Yazzie | H05K 1/0271 |
| 9,995,537 B2* | 6/2018 | Aoki | F28D 15/04 |
| 2004/0052052 A1* | 3/2004 | Rivera | H01L 23/4332 361/700 |
| 2005/0110099 A1 | 5/2005 | Shimogishi et al. | |
| 2006/0268517 A1 | 11/2006 | Wang et al. | |
| 2009/0244852 A1* | 10/2009 | Okada | H01L 23/433 361/721 |
| 2010/0265709 A1* | 10/2010 | Liu | F21V 29/763 362/249.02 |
| 2012/0307453 A1* | 12/2012 | Yan | H01L 23/427 361/704 |
| 2016/0270205 A1 | 9/2016 | Kamimura | |
| 2017/0068278 A1 | 3/2017 | Shen | |
| 2018/0120912 A1* | 5/2018 | Jenkins | H01L 23/4275 |

FOREIGN PATENT DOCUMENTS

| | | |
|---|---|---|
| CN | 102781199 A | 11/2012 |
| CN | 202841807 U | 3/2013 |
| CN | 103826426 A | 5/2014 |
| CN | 204042816 U | 12/2014 |
| CN | 105283040 A | 1/2016 |
| CN | 105704978 A | 6/2016 |
| CN | 106328215 A | 1/2017 |
| CN | 106662375 A | 5/2017 |
| CN | 206237317 U | 6/2017 |
| CN | 108207097 A | 6/2018 |
| EP | 0393236 A1 | 10/1990 |
| EP | 0630059 A2 | 12/1994 |
| EP | 2180773 A | 4/2010 |
| GB | 1239634 A | 7/1971 |
| JP | 2001210983 A | 8/2001 |

OTHER PUBLICATIONS

Examination Report No. 1 for Australia Application No. 2019218311, dated Apr. 30, 2021, 6 pages.
Office Action for Chinese Application No. 201810136695.4, dated Jan. 4, 2021, 12 pages (includes 5 pages of english translation).
First Search for Chinese Application No. 201810136695.4, 7 pages (includes 3 pages of english translation).
English Translation of the International Search Report and Written Opinion for PCT Application No. PCT/CN2019/074361, dated Apr. 28, 2019, 8 pages.
Examination Report for Australian Application No. 2019218311, dated Sep. 10, 2021, 5 pages.

* cited by examiner

HEAT-INSULATION DEVICE AND ELECTRONIC PRODUCT

CROSS-REFERENCE TO RELATED APPLICATION

The present application is a national stage filing under 35 U.S.C. § 371 of international application number PCT/CN2019/074361, filed Feb. 1, 2019, which claims priority to Chinese patent application No. CN201810136695.4, filed Feb. 9, 2018, entitled "heat-insulation device and electronic product". The contents of these applications are incorporated herein by reference in their entirety.

TECHNICAL FIELD

The present application relates to the technical field of electronic products, and in particular to a heat-insulation device and an electronic product including the heat-insulation device.

BACKGROUND

In the existing technology, there are mainly the following heat dissipation modes:

1. Heat dissipation through graphite: graphite has high heat conductivity in XY direction and low heat conductivity in Z direction; heat dissipation through graphite is mainly used to disperse heat, but due to the limited internal space of an electronic product, the temperature of heat sensitive components (such as batteries, cameras, GPS chips, etc.) or local surface areas near the heat source is caused to be too high while dispersing heat;

2. Heat dissipation through heat sink or heat-conducting tube: the heat sink is mainly made of metal with high heat conductivity, and the heat-conducting tube is used to bring the heat of a local overheated area to another place, so these two schemes can only achieve heat conduction, but cannot achieve effective heat insulation;

3. Heat insulation through air: the entire machine is thickened in the position where the temperature is determined to be too high, an air layer is added for heat insulation, but due to convection in the air layer, the heat-insulation effect is poor; and 4. Heat insulation through heat-insulation pad: the heat-insulation pad has poor heat-insulation effect, so the heat of a heating device can't be homogenized, resulting in too high temperature of the heating device, and the heat-insulation pad can't be designed into a solid form, and thus it is difficult to fully protect a heat-sensitive device.

In the current electronic products, the heat insulation method is seldom used, and the heat problem is mainly solved by heat dissipation, but only using heat dissipation has great limitations on products, and it is difficult to protect heat-labile components. If the thickness of the entire machine is increased and the heat insulation with air is added on the basis of using heat dissipation, the size of the entire machine is increased, and the internal heat insulation is be affected by air convection, so the heat reliability cannot be guaranteed, and it is difficult to achieve satisfactory results under different power consumption conditions.

SUMMARY

The following is a summary of the subject matter described in detail herein. This summary is not intended to limit the protection scope of the claims.

According to an embodiment of the present application, a heat-insulation device is provided, the heat-insulation device is of a closed hollow structure, and includes a first cover body and a second cover body arranged opposite to each other; a vacuum cavity is formed in the heat-insulation device;

the first cover body is made of a heat-conducting material; and a heat-conducting element is provided in the vacuum cavity, and a first end of the heat-conducting element is in contact with an inner wall surface of the first cover body.

Optionally, a second end of the heat-conducting element is in contact with an inner wall surface of the second cover body.

Optionally, the first cover body is arranged close to a heating element, and an area of the first cover body corresponding to the heat-conducting element and an area of the first cover body corresponding to the heating element are at least partially overlapped.

Optionally, the second cover body is arranged close to a heat-sensitive device, and the second cover body comprises a first area corresponding to the heat-conducting element and a second area corresponding to the heat-sensitive device, wherein the first area and the second area are arranged in a staggered manner or at least partially overlapped.

Optionally, the heat-conducting element is movably arranged in the vacuum cavity.

Optionally, the heat-conducting element is capable of rotating and/or moving within the vacuum cavity.

Optionally, a rotatable rotating shaft is provided in the vacuum cavity, and the heat-conducting element is connected with the rotating shaft.

Optionally, the heat-insulation device further includes a first driving component, wherein the first driving component is connected with the rotating shaft and is capable of driving the rotating shaft to rotate.

Optionally, the first driving component includes a rotating motor or a manual rotating part, the first driving component is located outside the vacuum cavity, one of the first cover body and the second cover body is provided with an installation through hole, and one end of the rotating shaft is connected with the first driving component after passing through the installation through hole.

Optionally, the heat-insulation device further includes a second driving component, wherein the second driving component is capable of driving the heat-conducting element to move.

Optionally, the second driving component includes a linear motor, and the linear motor is located outside the vacuum cavity, one of the first cover body and the second cover body is provided with an installation through hole, and the linear motor is connected with the heat-conducting element through the installation through hole;

or, the second driving component includes a manual toggle part, wherein one of the first cover body and the second cover body is provided with an installation through hole, one end of the manual toggle part is located outside the vacuum cavity, and the other end of the manual toggle part is connected with the heat-conducting element through the installation through hole.

Optionally, the second cover body is provided with a groove, and the groove is configured to accommodate the heat-sensitive device.

Optionally, a plurality of heat-conducting elements are provided, and the plurality of heat-conducting elements are arranged at intervals.

Optionally, the heat-conducting element is integrated with the first cover body; or, the heat-conducting element is integrated with the second cover body.

Optionally, the second cover body is made of a heat-insulation material or a heat-conducting material.

In the heat-insulation device, by means of heat conduction by a first cover plate and a heat-conducting element, the heat dissipation of a heating element is achieved; by means of the vacuum cavity, the heat conduction between the heating element and a heat-sensitive device is isolated to protect the normal operation of the heat-sensitive device; in addition, by means of the heat-conducting element, the adjustment of local temperature of the second cover body is achieved, and thermal balance of the heat-sensitive device or the entire machine is achieved on the premise that the temperature of the heat-sensitive device close to one side of the second cover body meets requirements.

According to an embodiment of the present application, an electronic product is provided, the electronic product includes a heating element and the heat-insulation device described above, the heating element is arranged close to the first cover body of the heat-insulation device.

Optionally, the electronic product further includes a heat-sensitive device, wherein the heat-sensitive device is arranged close to the second cover body of the heat-insulation device.

Optionally, a plurality of heating elements are provided, the plurality of heating elements are arranged around the first cover body, and the heat-sensitive device is accommodated in a groove of the second cover body.

Optionally, a plurality of heat-sensitive devices and a plurality of heat-insulation devices are provided, each of the heat-sensitive devices is accommodated in one groove of the second cover body, the plurality of heat-insulation devices are sequentially arranged, and at least a part of one of two adjacent heat-insulation devices is accommodated in a groove of the other heat-insulation device.

Optionally, the second cover body of the heat-insulation device constitutes a part of a shell of the electronic product.

The above-mentioned electronic product utilizes the heat-insulation device to perform heat insulation, heat dissipation and local temperature adjustment, so that the heat-sensitive device and heating element of the electronic product can operate normally, and thereby improving the service performance of the electronic product.

In the figures, the relationship between reference numerals and names of the components in FIGS. 1-11 is as follows:

100, 100' heat-insulation device,
1, 1' first cover body,
2, 2' second cover body,
20, 20' groove,
3, 3' vacuum cavity,
40-42 heat-conducting element,
50 rotating shaft,
51 rotating motor,
52 manual rotating part,
54 manual toggle part,
6 heating element,
7, 7' heat-sensitive device,
8 PCB.

DETAILED DESCRIPTION

Objects, technical schemes and advantages of the present application will be clearer from a detailed description of embodiments of the present application in conjunction with the drawings. It should be noted that if not in collision, the embodiments and features therein in the present application may be combined with each other.

Embodiment 1

Figure 1:
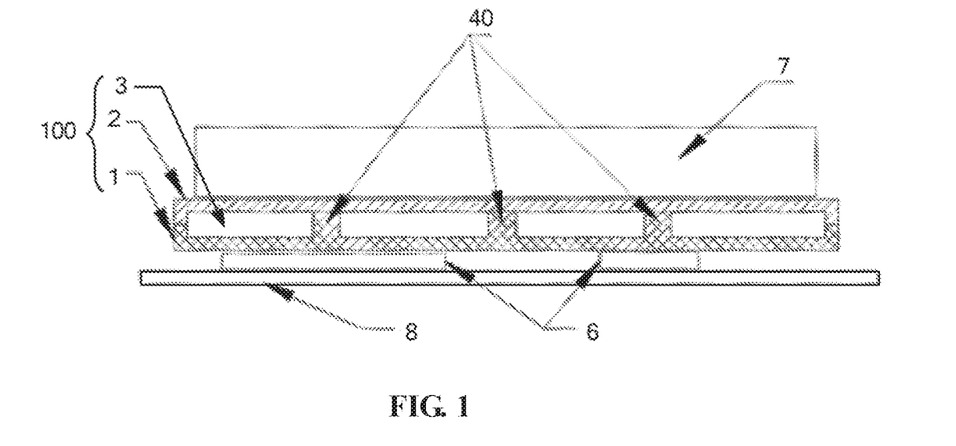
FIG. 1 is a structural schematic diagram of a heat-insulation device in a use state according to embodiment 1 of the present application.

As shown in FIG. 1, a heat-insulation device 100 is provided in this embodiment, which is used between a heating element 6 and a heat-sensitive device 7, that is, the heating element 6 and the heat-sensitive device 7 are respectively arranged on two sides of the heat-insulation device 100. The heating element 6 is electrically connected with a printed circuit board (PCB) 8, and the operation of the heating element 6 is controlled by the PCB 8. The heat-insulation device 100 can prevent the heat generated by the heating element 6 from being transferred to the heat-sensitive device 7 and affecting the normal operation of the heat-sensitive device 7.

Specifically, the heat-insulation device 100 is of a closed hollow structure, and includes a first cover body 1 and a second cover body 2 arranged opposite to each other. The first cover body 1 and the second cover body 2 are hermetically connected, and a vacuum cavity 3 is formed in the first cover body 1 and the second cover body 2 by vacuumizing. The vacuum cavity 3 has a heat-insulation function, so heat transfer can be prevented or slowed down. A vacuum layer in the vacuum cavity 3 may be configured with different thicknesses according to the heat-insulation requirements, generally, the higher the heat insulation requirements, the greater the thickness of the vacuum layer. When used in the electronic product, the thickness of the vacuum layer is usually not less than 0.5 mm.

It should be understood that the first cover body 1 and the second cover body 2 are hermetically connected, which may mean that the first cover body 1 and the second cover body 2 are directly connected to form a sealed vacuum cavity, or that the first cover body 1 and the second cover body 2 are indirectly connected to form a sealed vacuum cavity through other components.

The first cover body 1 is made of a heat-conducting material, thus the first cover body 1 has good heat-conducting performance, and the first cover body 1 is arranged close to the heating element 6, so that heat generated by the heating element 6 can be transferred to the first cover body 1, so as to perform heat dissipation on the heating element 6, thereby reducing the temperature of the heating element 6 and facilitating the normal operation of the heating element 6. The second cover body 2 is arranged far away from the heating element 6 and close to the heat-sensitive device 7. Due to the heat-insulation effect of the vacuum cavity 3, the heat of the first cover body 1 is less transferred to the second cover body 2 after passing through the vacuum cavity 3, that is, the heat-insulation device 100 functions as heat isolation between the heating element 6 and the heat-sensitive device 7 to ensure the normal operation of the heat-sensitive device 7.

In the heat-insulation device 100 of this embodiment, the heat transfer rate along the first cover body 1 is high, but due to the arrangement of the vacuum cavity 3, the heat transfer rate in the direction from the first cover body 1 to the second cover body 2 is low, thus achieving two effects of heat dissipation and heat insulation protection.

Furthermore, a heat-conducting element 40 is provided in the vacuum cavity 3, and a first end of the heat-conducting element 40 is in contact with the inner wall surface of the first cover body 1. In this way, the heat of the first cover body 1 can be conducted to the heat-conducting element 40, being beneficial for reducing the heat of the first cover body 1 and thereby being beneficial for performing heat dissipation on the heating element 6.

Optionally, a second end of the heat-conducting element 40 is in contact with the inner wall surface of the second cover body 2, so that the two ends of the heat-conducting element 40 are in contact with the inner wall surface of the first cover body 1 and the inner wall surface of the second cover body 2 respectively. In this way, the heat of the first cover body 1 can be conducted to the second cover body 2 through the heat-conducting element 40. On the one hand, it is beneficial for reducing the heat of the first cover body 1 and performing heat dissipation on the heating element 6. On the other hand, since the temperature of the area of the second cover body 2 which is in contact with the heat-conducting element 40 is higher, while the temperature of the area of the second cover body 2 which is not in contact with the heat-conducting element 40 is lower, thereby achieving the adjustment of local temperature of the second cover body 2.

The heat-conducting element 40 may be arranged at the position where heat is needed to be conducted to the second cover body 2 to achieve the adjustment of local temperature of the second cover body 2, may be applied to the case where a plurality of heat-sensitive devices 7 are provided on one side of the second cover body 2, to raise the temperature of the interval parts of the plurality of heat-sensitive devices 7 as much as possible on the premise of ensuring that the temperature of the heat-sensitive devices 7 meets the requirements and achieve thermal balance of the entire machine, and may also be applied to the case where different parts of a certain heat-sensitive device 7 have different temperatures, to achieve temperature balance of the entire heat-sensitive device 7.

For example, in the case where the heat-sensitive device 7 is a battery, the temperatures of various parts are different when the battery operates, so that the part of the battery with lower temperature may correspond to the area of the second cover body 2 with higher temperature (i.e., correspond to the heat-conducting element 40), and the part of the battery with higher temperature may correspond to the area of the second cover 2 with lower temperature, to achieve temperature balance of the entire battery when operating. In this case, on the second cover body 2, the first area corresponding to the heat-conducting element 40 and the second area corresponding to the heat-sensitive device 7 are at least partially overlapped.

Alternatively, for example, in the case where a plurality of heat-sensitive devices are provided, the plurality of heat-sensitive devices 7 may correspond to the areas of the second cover body 2 with lower temperature, that is, the heat-sensitive devices 7 and the heat-conducting elements 40 are arranged in a staggered manner. In this way, the temperature of other parts outside the heat-sensitive devices 7 is raised as much as possible on the premise of ensuring that the temperature of the heat-sensitive devices 7 meets the requirements, and thermal balance of the entire machine is achieved. In this case, on the second cover body 2, the first area corresponding to the heat-conducting element 40 and the second area corresponding to the heat-sensitive device 7 are arranged in a staggered manner.

By means of arranging the heat-conducting element 40, the adjustment of temperature of the non-heat source surface (i.e., the surface not opposite to the heating element 6, that is the surface of the second cover body 2 in this embodiment) of the heat-insulation device 100 is achieved, so that the temperature of the non-heat source surface may be designed according to specific requirements, so as to be beneficial for ensuring the normal operation of the heat-sensitive device 7 and improving the heat dissipation effect.

In addition, two ends of the heat-conducting element 40 are in contact with the inner wall surface of the first cover body 1 and the inner wall surface of the second cover body 2 respectively. In this way, the heat-conducting element 40 may play a role of supporting the first cover body 1 and the second cover body 2, thereby improving the structural strength of the heat-insulation device 100, and preventing the first cover body 1 or the second cover body 2 from being deformed under atmospheric pressure or other pressures.

Since the area of the first cover body 1 corresponding to the heating element 6 has a fast temperature rise and a high temperature, while the area of the first cover body 1 corresponding to the heat-conducting element 40 has a good heat-conducting effect, if the area corresponding to the heating element 6 and the area corresponding to the heat-conducting element 40 are at least partially overlapped on the first cover 1, the heat-conducting element 40 may effectively conduct heat, thereby being beneficial for improving the heat dissipation effect.

Certainly, according to the actual situation, on the first cover body 1, the area corresponding to the heating element 6 and the area corresponding to the heat-conducting element 40 may not be overlapped, but are arranged in a staggered manner, that is, the heat-conducting element 40 is arranged to not correspond to the heating element 6. If the plurality of heating elements 6 operate simultaneously, the position of the heat-conducting element 40 may be set according to the heating conditions of the plurality of the heating elements 6. In this case, the heat-conducting elements 40 may not correspond to the heating element 6.

Since the temperature of the area of the second cover body 2 which is in contact with the heat-conducting element 40 is higher and the temperature of the area which is not in contact with the heat-conducting element 40 is lower, the heat-conducting element 40 and the heat-sensitive device 7 are arranged in a staggered manner (the first area and the second area of the second cover body 2 are arranged in a staggered manner), that is, the heat-sensitive device 7 corresponds to the area of the second cover 2 with lower temperature, so as to prevent the high temperature on the second cover body 2 from affecting the normal operation of the heat-sensitive device 7.

Optionally, if there are a plurality of heat-sensitive devices 7, instead of being arranged correspondingly, the heat-conducting elements 40 and the heat-sensitive devices 7 may be arranged in a staggered manner. In this way, on the premise of ensuring that the temperature of the heat-sensitive devices 7 meets the requirements, the temperature of the interval parts between the heat-sensitive devices 7 may be raised as much as possible, to achieve thermal balance of the entire machine.

Optionally, the heat-conducting element 40 is fixed in the vacuum cavity 3. The heat-insulation device 100 is suitable for the case where the same heating element 6 is always operating when the same device operates in different scenarios. Since the position of the heating element 6 is unchanged, the position of the heat-conducting element 40 is set according to the heating condition of the heating element 6, and the heat-conducting element 40 is fixed at this position, so that the heat-conducting element 40 can perform effective heat dissipation on the heating element 6.

Optionally, the fixed heat-conducting element 40 may be integrated with the first cover body 1, alternatively, the fixed heat-conducting element 40 may be integrated with the second cover body 2. If the heat-conducting element 40 is integrated with the first cover body 1 or is integrated with the second cover body 2, the step of fixedly connecting the heat-conducting element 40 may be omitted, thereby facilitating assembling of the heat-insulation device 100. Optionally, the second cover body 2 is configured to be made of a heat-insulation material or a heat-conducting material.

Optionally, the first cover body 1 and the second cover body 2 are connected by gluing or welding, being beneficial for ensuring the hermetic connection between the first cover body 1 and the second cover body 2, and thereby ensuring the tightness of the vacuum cavity 3, so as to ensure the vacuum degree and heat-insulation effect of the vacuum cavity 3.

Optionally, the first cover body 1 is made of a material with high heat conductivity, such as metal or ceramic. Such material has the main characteristics of high strength and small deformation, and has the main function of conducting heat on the lower surface of the heat-insulation device 100, so as to make the temperature of the lower surface of the first cover body 1 of the heat-insulation device 100 uniform, and achieve thermal balance of various heating elements 6 and other devices at the bottom.

Optionally, the second cover body 2 is made of a material with low or high heat conductivity, such as plastic, glass, metal or ceramic. Such material has the main characteristics of high strength and small deformation, and the specific material is mainly selected according to the temperature requirements of the heat-sensitive device 7.

Optionally, the wall thickness of the first cover body 1 and the second cover body 2 may be set according to the needs of the vacuum cavity 3, so as to ensure that the deformation of the first cover body 1 and the second cover body 2 is small after forming the vacuum cavity 3 by vacuumizing.

To sum up, the heat-insulation device 100 of this embodiment achieves protection of the heat-sensitive device 7 without affecting the heat dissipation of the heating element 6, and meets the requirements of heat insulation or local heat conduction of the electronic product through the vacuum cavity 3 and the heat-conducting element 40.

It should be noted that, in this embodiment, "corresponding" should be understood as follows: for example, taking "the first area on the second cover body corresponding to the heat-conducting element" as an example, if the heat-conducting element is in contact with the second cover body, the first area refers to the area on the second cover body that is in contact with the heat-conducting element, and if the heat-conducting element is not in contact with the second cover body, the first area refers to the area where the heat-conducting element is projected on the second cover body. The meaning of "corresponding" in "the second area on the second cover body corresponding to heat-sensitive device", "the area on the first cover body corresponding to the heat-conducting element", and "the area on the first cover body corresponding to the heating element" and so on is the same as that of "corresponding" in "the first area on the second cover body corresponding to the heat-conducting element".

Embodiment 2

Figure 2:
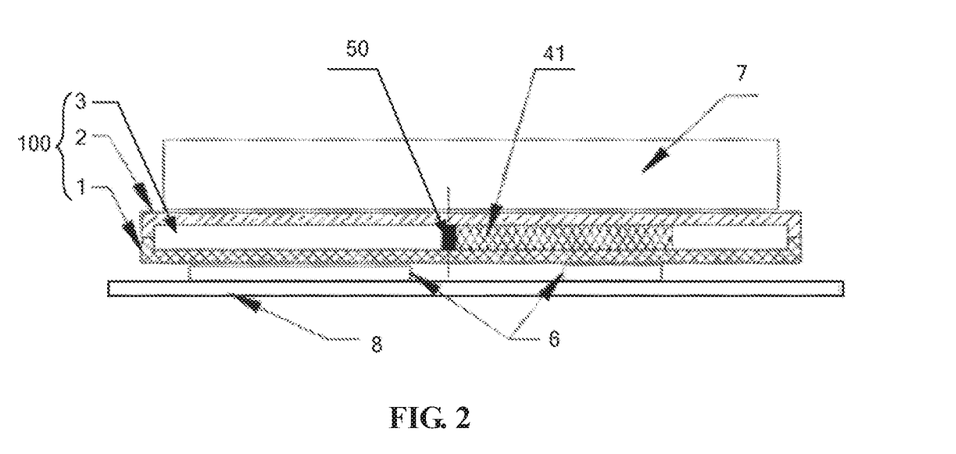
FIG. 2 is a structural schematic diagram of a heat-insulation device in a use state according to embodiment 2 of the present application.

As shown in FIG. 2, a heat-insulation device 100 is provided in this embodiment, which is mainly different from the heat-insulation device 100 described in the embodiment 1 in that: in this embodiment, the heat-conducting element 41 is movably arranged in the vacuum cavity 3.

When a same device operates in different scenarios through different heating elements 6, in order to ensure that the heat-conducting element 41 can perform effective heat dissipation on the operating heating elements 6, the heat-conducting element 41 is movably arranged in the vacuum cavity 3, so that the heat-conducting element 41 may move in the vacuum cavity 3. Thus, the position of the heat-conducting element 41 may be changed when the positions of the operating heating elements 6 are different, so as to achieve heat dissipation of the heating elements 6 and heat insulation of the heat-sensitive devices 7.

According to the heating position, the temperature of each internal area is adjusted by the user according to the instructions of the software before or after delivery. The scheme requires various different scenarios to be preset, so that the user may correspondingly select corresponding preset scenarios according to different use scenarios; or a thermistor may be arranged in the electronic product to test the temperature, and the position of the heat-conducting element 41 may be adjusted according to different tested temperatures, so as to achieve the real-time adjustment of temperature of the entire machine.

Figure 3:
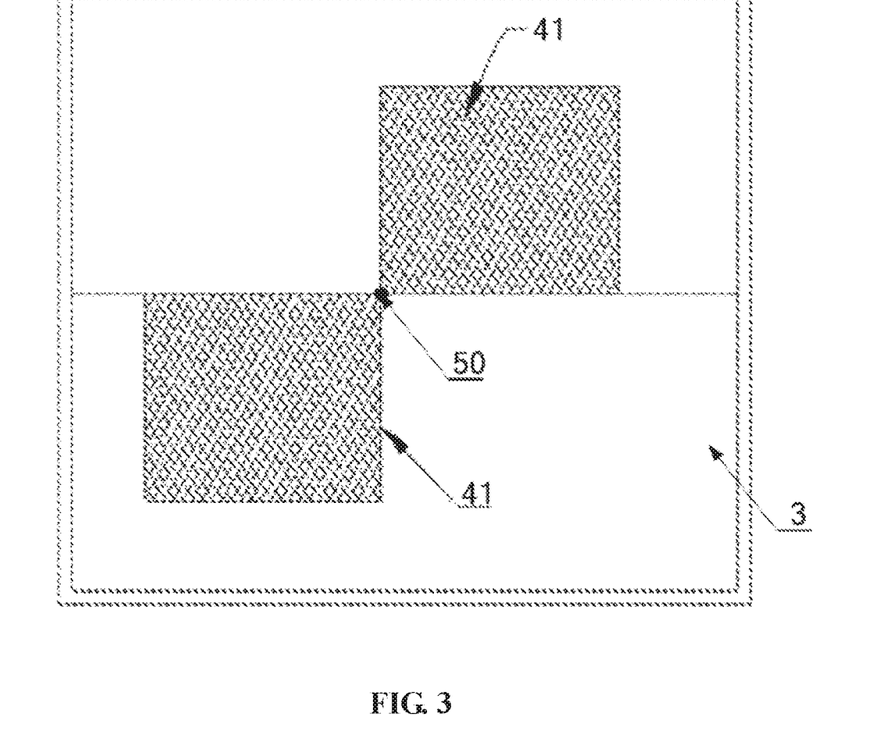
FIG. 3 is an internal structural schematic diagram of the heat-insulation device shown in FIG. 2.

Optionally, the heat-conducting element 41 may rotate in the vacuum cavity 3. Specifically, in this embodiment, a rotatable rotating shaft 50 is provided in the vacuum cavity 3, and the heat-conducting element 41 is connected with the rotating shaft 50, so that the heat-conducting element 41 may rotate together with the rotating shaft 50 to change the position of the heat-conducting element 41.

Optionally, the heat-insulation device 100 further includes a rotatable driving component. The rotatable driving component is connected with the rotating shaft 50 and may drive the rotating shaft 50 to rotate, and thereby the rotating shaft 50 driving the heat-conducting element 41 to rotate.

Figure 4:
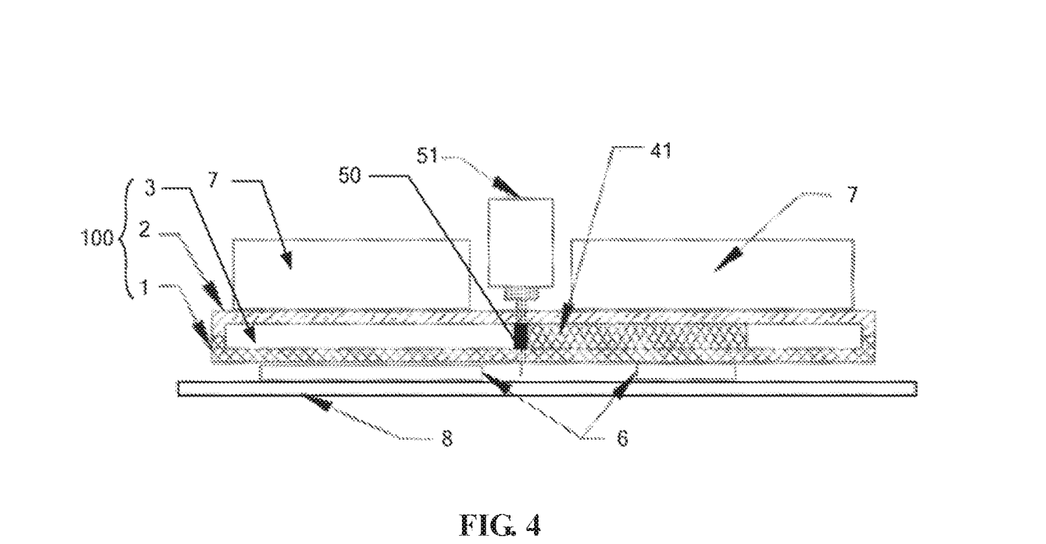
FIG. 4 is a structural schematic diagram of an example of the heat-insulation device shown in FIG. 3.

In one example, as shown in FIG. 4, the rotatable driving component includes a rotating motor 51. The rotating motor 51 may be a DC motor and may drive the rotating shaft 50 to rotate during operation, and then the rotating shaft 50 drives the heat-conducting element 41 to rotate. Optionally, the rotating motor 51 is located outside the vacuum cavity 3, the first cover body 1 or the second cover body 2 is provided with an installation through hole, and one end of the rotating shaft 50 is connected with the rotating motor 51 after passing through the installation through hole.

Figure 5:
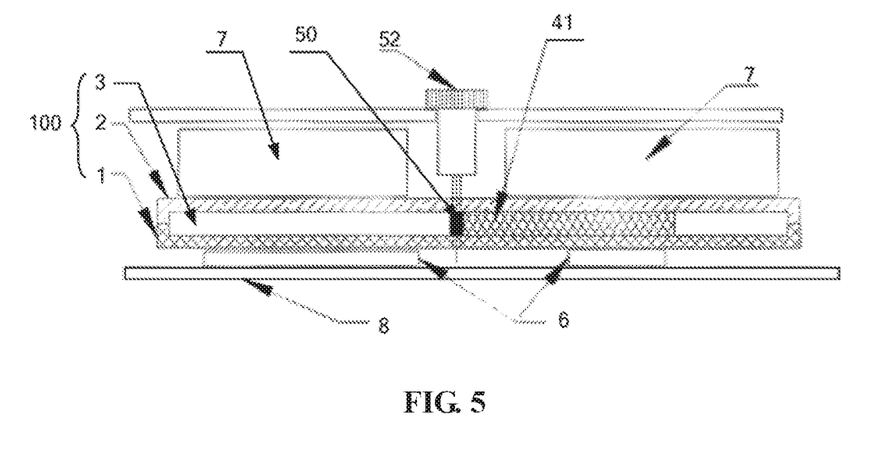
FIG. 5 is a structural schematic diagram of another example of the heat-insulation device shown in FIG. 3.

In another example, as shown in FIG. 5, the rotatable driving component includes a manual rotating part 52. The manual rotating part is located outside the vacuum cavity 3, the first cover body 1 or the second cover body 2 is provided with an installation through hole, and one end of the rotating shaft 50 is connected with the manual rotating part 52 after passing through the installation through hole.

When there is a need to change the position of the heat-conducting element 41 since the position of the operating heating element 6 is changed, the manual rotating part 52 may be rotated manually, the manual rotating part 52 drives the heat-conducting element 41 to rotate through the rotating shaft 50, or drives the heat-conducting element 41 to rotate through the rotating motor 51 to change the position of the heat-conducting element 41, so that the heat-conducting element 41 rotates clockwise or counterclockwise from the upper right position in FIG. 3 to the lower left position, and therefore the heat-conducting element 41 can perform effective heat dissipation on the operating heating element 6.

In order to ensure the tightness of the vacuum cavity 3, there is a need to provide a sealing device (such as a sealing ring or sealing oil, etc.) at the installation through hole to ensure the vacuum degree in the vacuum cavity 3 and ensure the heat insulation performance of the vacuum cavity 3.

To sum up, in the heat-insulation device 100 of this embodiment, the temperature of different positions in the electronic product may be adjusted by manually or automatically adjusting the position of the heat-conducting element 41, so as to meet the thermal balance requirements of different positions in different scenarios of the electronic product. Compared with the scheme in embodiment 1, the heat-insulation device 100 of this embodiment has the advantage of being able to adjust the temperature.

Embodiment 3

Figure 6:
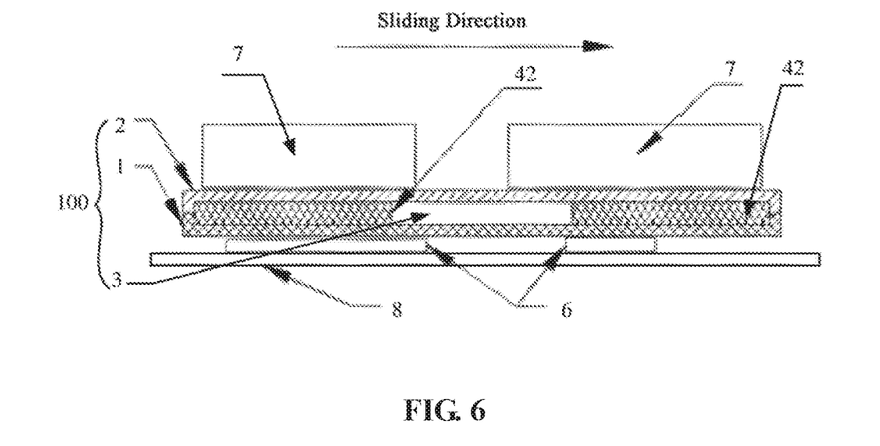
FIG. 6 is a structural schematic diagram of the heat-insulation device in a use state according to embodiment 3 of the present application.

As shown in FIG. 6, a heat-insulation device 100 is provided in this embodiment, which is mainly different from the heat-insulation device 100 described in the embodiment 2 in the movement mode of the heat-conducting element 42 in the vacuum cavity 3.

In this embodiment, the heat-conducting element 42 may move in the vacuum cavity 3, for example, in the front-back direction or the left-right direction. As shown in FIG. 6, the heat-conducting element 42 may move from the left position in FIG. 6 to the right position along the sliding direction indicated by the arrow.

Optionally, the heat-insulation device 100 further includes a linear driving component. The linear driving component may drive the heat-conducting element 42 to move.

In one example, the linear driving component may be a linear motor, and the linear motor is located outside the vacuum cavity 3. The first cover body 1 or the second cover body 2 is provided with an installation through hole, and the linear motor is connected with the heat-conducting element 42 through the installation through hole. When there is a need to change the position of the heat-conducting element 42, the linear motor is started to drive the heat-conducting element 42 to move, so that the heat-conducting element 42 may move to an appropriate position according to the position of the operating heating element 6.

Figure 7:
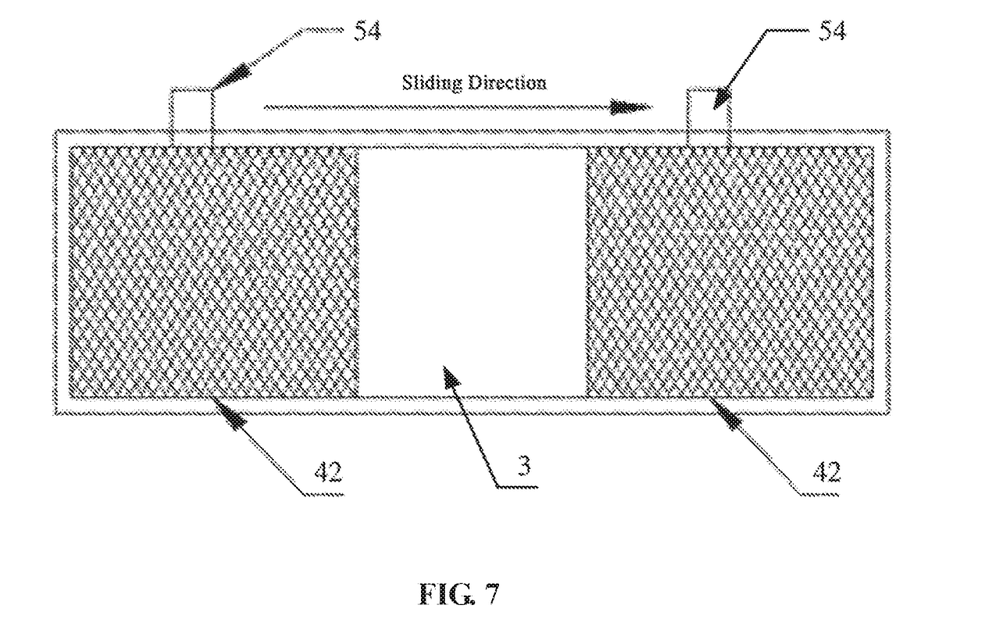
FIG. 7 is an internal structural schematic diagram of the heat-insulation device shown in FIG. 6.

In another example, as shown in FIG. 7, the linear driving component may include a manual toggle part 54, the first cover body 1 or the second cover body 2 is provided with an installation through hole, one end of the manual toggle part 54 is located outside the vacuum cavity 3, and the other end of the manual toggle part is connected with the heat-conducting element 42 through the installation through hole. When there is a need to change the position of the heat-conducting element 42, one end of the manual toggle part 54 is manually toggled, and the manual toggle part 54 drives the heat-conducting element 42, so that the heat-conducting element 42 moves from the left position in FIG. 7 to the right position along the sliding direction indicated by the arrow, and thus the heat-conducting element 42 may move to an appropriate position according to the position of the operating heating element 6.

Optionally, in order to guide the movement of the heat-conducting element 42, a guide rail and a slider structure may be arranged at the installation through hole, the linear motor or the manual toggle part 54 may drive the slider to move along the guide rail, and the slider is connected with the heat-conducting element 42 and drives the heat-conducting element 42 to move.

Certainly, in this embodiment, the vacuum cavity 3 also needs to be sealed.

It should be understood that the heat-conducting element may rotate and move when being movably arranged in the vacuum cavity.

Embodiment 4

Figure 8:
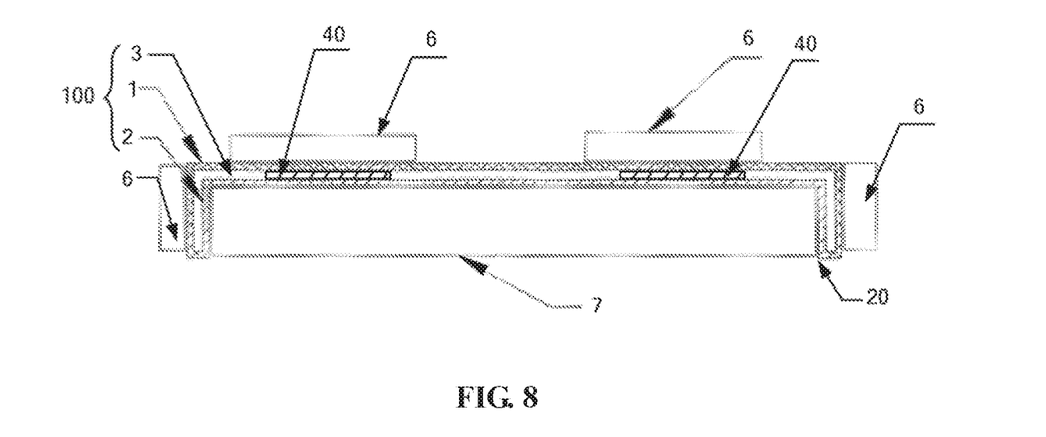
FIG. 8 is a structural schematic diagram of the heat-insulation device in a use state according to embodiment 4 of the present application.

This embodiment provides a heat-insulation device 100, which is mainly different from the heat-insulation device 100 described in the embodiment 1 in the structure of the second cover body 2.

As shown in FIG. 8, in this embodiment, the second cover body 2 is provided with a groove 20, and the groove 20 is configured to accommodate the heat-sensitive device 7. In this way, the groove 20 can perform heat insulation in multiple directions, so as to protect the heat-sensitive device in all directions around the heat-sensitive device 7.

The heat-insulation device 100 of this embodiment is mainly applied to the case where the heat-sensitive device 7 needs to be fully protected, and only the side with low temperature or wiring due to assembly is grooved, that is, the opening of the groove 20 faces the side with low temperature or the side needing wiring. The heat-insulation device 100 of this embodiment may be applied to vehicle-mounted products. Because the ambient temperature is too high, heat-sensitive devices such as batteries, etc. need all-round heat insulation protection, so as to avoid the influence of ambient temperature and heating elements on the operation of the heat-sensitive devices.

In addition, the heat-insulation device of this embodiment may also be applied to other cases, such as: the heat-insulation device may replace the shielding cover in the existing electronic product, achieve the heat uniformity in the groove and isolate the heat from the outside; alternatively, the heat-insulation device may replace the current battery surface package, and the battery core may be arranged in the groove, to isolate the influence of the ambient temperature on the battery and greatly reduce the heat of the battery.

Figure 9:
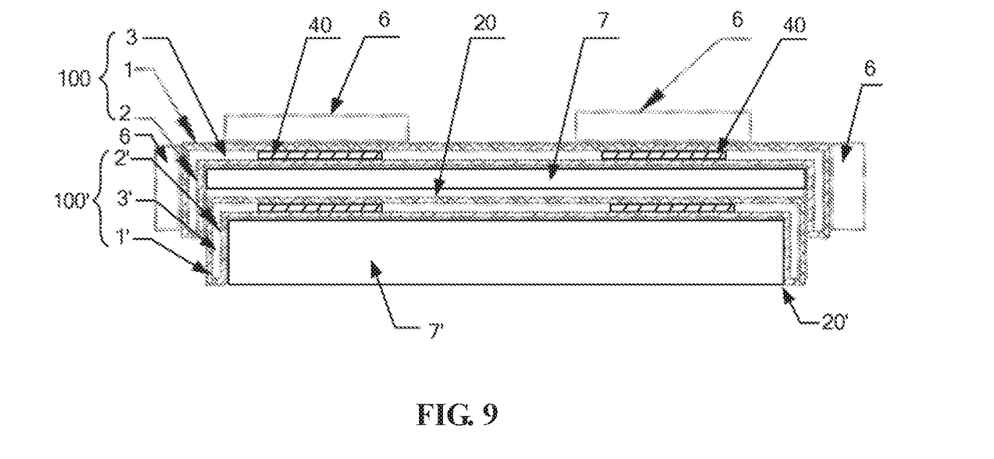
FIG. 9 is a structural schematic diagram of the heat-insulation device shown in FIG. 8 in another use state.

Double-layer or multi-layer protection may also be established by means of the heat-insulation device of this embodiment. In this case, a plurality of heat-insulation devices are required to be provided, wherein the plurality of heat-insulation devices are arranged in sequence, and at least a part of one of two adjacent heat-insulation devices is accommodated in the groove of the other heat-insulation device.

Specifically, as shown in FIG. 9, double-layer protection is achieved by providing two heat-insulation devices 100, 100'. At least a part of one heat-insulation device 100' of the two heat-insulation devices 100, 100' is arranged in the groove 20 of the other heat-insulation device 100. In this way, the heat-sensitive device 7' located in the groove 20' of the heat-insulation device 100' may be subjected to double-layer heat insulation of the vacuum cavity 3 of the heat-insulation device 100 and the vacuum cavity 3' of the heat-insulation device 100' (formed in the first cover body 1' and the second cover body 2' which are hermetically connected), so that the temperature of the heat-sensitive device 7' in the groove 20' is lower than that of the heat-sensitive device 7 in the groove 20. In this way, when there are a plurality of heat-sensitive devices and the temperatures required by the plurality of heat-sensitive devices are different, a plurality of heat-insulation devices are arranged to achieve multi-layer heat-insulation protection.

Embodiment 5

Figure 10:
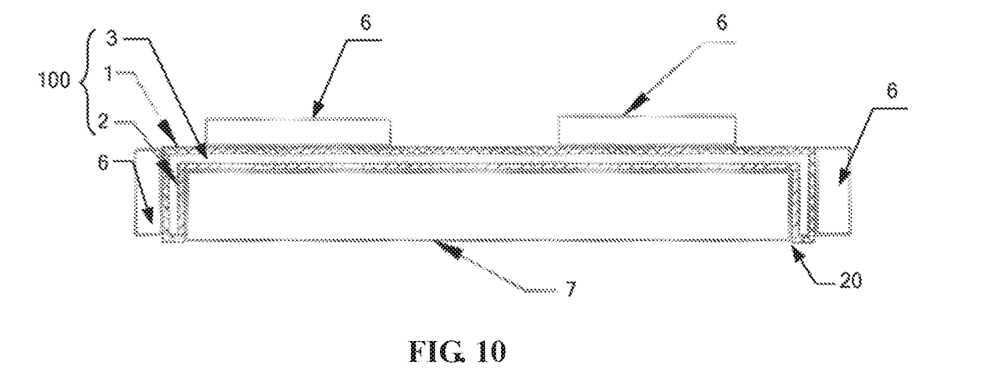
FIG. 10 is a structural schematic diagram of a heat-insulation device in a use state according to embodiment 5 of the present application.

This embodiment provides a heat-insulation device 100, which is mainly different from the heat-insulation device described in the embodiment 4 in that: no heat-conducting element is arranged in the heat-insulation device.

As shown in FIG. 10, in this embodiment, by means of the groove 20 in the second cover body 2, the heat-insulation device 100 performs heat insulation on the heat-sensitive device 7 accommodated in the groove in multiple directions, so as to protect the heat-sensitive device in all directions around the heat-sensitive device 7.

Figure 11:
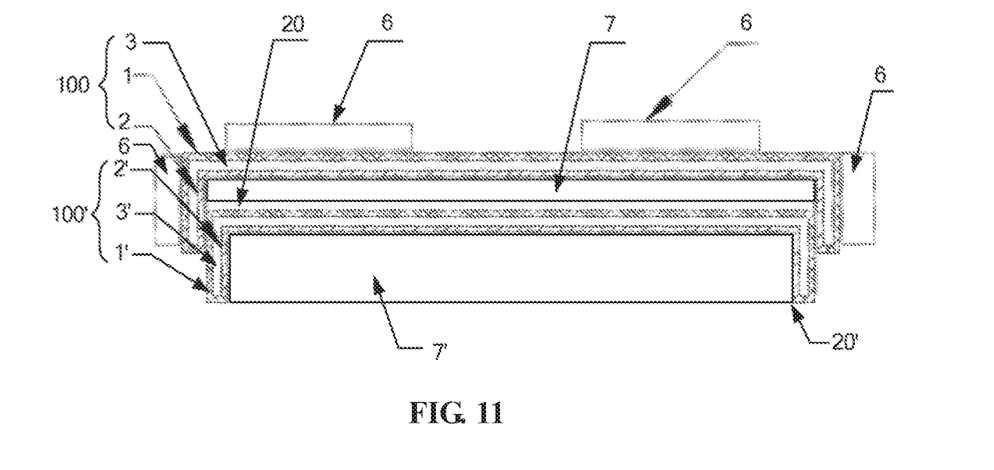
FIG. 11 is a structural schematic diagram of the heat-insulation device shown in FIG. 10 in another use state.

Also as shown in FIG. 11, two heat-insulation devices 100, 100' are arranged to achieve double-layer heat-insulation protection for the heat-sensitive device 7' in the groove 20'.

The heat-insulation devices shown in FIG. 10 and FIG. 11 may be applied to the same case as the heat-insulation devices shown in FIG. 8 and FIG. 9.

Embodiment 6

This embodiment provides an electronic product, including a heating element 6 and the heat-insulation device 100 as mentioned in any one of the above embodiments, the heating element 6 being arranged close to the first cover body 1 of the heat-insulation device 100.

Optionally, the electronic product further includes a heat-sensitive device 7, the heat-sensitive device 7 being close to the second cover body 2 of the heat-insulation device 100. On the one hand, the heat dissipated by the heating element 6 may be dissipated through the first cover body 1, and on the other hand, the vacuum cavity 3 of the heat-insulation device 100 may be used for heat insulation to prevent the heat from being transferred to the heat-sensitive device 7.

Optionally, if a plurality of the heating elements 6 are provided and the plurality of heating elements 6 are arranged around the first cover body 1, the heat-insulation device 100 described in embodiment 4 or embodiment 5 may be selected, and the heat-sensitive device 7 is accommodated in the groove 20 in the second cover body 2, as shown in FIG. 8 and FIG. 10.

Optionally, if plurality of heat-sensitive devices are provided and the temperature requirements of the plurality of heat-sensitive devices 7, 7' are different, a plurality of heat-insulation devices may be provided, such as the heat-insulation devices 100, 100' described in embodiment 4 or embodiment 5, each heat-sensitive device 7, 7' is accommodated in one groove 20, 20', then the plurality of heat-insulation devices 100, 100' are sequentially arranged, and at least a part of one insulation device 100' of two adjacent insulation devices 100, 100' is accommodated in the groove 20 of the other insulation device 100, as shown in FIG. 9 and FIG. 11. In this way, multiple heat insulation may be achieved by a plurality of heat-insulation devices 100, 100', and thereby achieving multiple protection for the heat-sensitive device 7'.

Optionally, the second cover body 2 of the heat-insulation device 100 may constitute a part of a shell of the electronic product. For example, the second cover body 2 of the heat-insulation device 100 may be combined with the shell of a smart phone to prevent heat from being transferred to the shell and reduce the local temperature on the surface of the phone. In this case, there is no need to arrange a heat-sensitive device 7 on the side close to the second cover body 2.

Optionally, the electronic product may be mobile terminal (such as smart phone, iPad, or the like), system cabinet, wireless router (CPE and UFI), vehicle-mounted or outdoor electronic product, etc. The heat-insulation device may be applied to heat insulation of batteries or other heat-sensitive devices, especially may be applied to different environmental temperatures or different temperatures of electronic products in different scenarios.

In the description of the present application, the term "multiple" or "a plurality of" means two or more.

It should be noted that, in the description of the present application, heat-conducting material generally refers to material with heat conductivity above 5 W/(m·K), such as metal (such as stainless steel, aluminum, copper, etc.), heat conduction ceramic, heat conduction glass, heat conduction plastics, or the like, and the heat-conducting element is made of heat-conducting material.

Although the embodiments disclosed in the present application are as above, the content described is only the embodiments adopted to facilitate understanding of the present application, and is not intended to limit the present application. Those skilled in the art to which this application belongs can make any modifications and changes in the form and details of implementation without departing from the concept and scope disclosed in this application, however, the scope of the present application shall still be subject to the scope defined by the attached claims.

The invention claimed is:

1. A heat-insulation device, being of a closed hollow structure, and comprising a first cover body and a second cover body arranged opposite to each other;
wherein:
a vacuum cavity is formed in the heat-insulation device;
the first cover body is made of a heat-conducting material; and
a heat-conducting element is provided in the vacuum cavity, and a first end of the heat-conducting element is in contact with an inner wall surface of the first cover body;
wherein the heat-conducting element is movably arranged in the vacuum cavity.

2. The heat-insulation device of claim 1, wherein a second end of the heat-conducting element is in contact with an inner wall surface of the second cover body.

3. The heat-insulation device of claim 1, wherein the first cover body is arranged close to a heating element, and an area of the first cover body corresponding to the heat-conducting element and an area of the first cover body corresponding to the heating element are at least partially overlapped.

4. The heat-insulation device of claim 1, wherein the second cover body is arranged close to a heat-sensitive device, and the second cover body comprises a first area corresponding to the heat-conducting element and a second area corresponding to the heat-sensitive device, wherein the first area and the second area are arranged in a staggered manner or at least partially overlapped.

5. The heat-insulation device of claim 1, wherein the heat-conducting element is capable of rotating and/or moving within the vacuum cavity.

6. The heat-insulation device of claim 1, wherein a rotatable rotating shaft is provided in the vacuum cavity, and the heat-conducting element is connected with the rotating shaft.

7. The heat-insulation device of claim 1, further comprising a first driving component, wherein the first driving component is connected with the rotating shaft and is capable of driving the rotating shaft to rotate.

8. The heat-insulation device of claim 7, wherein the first driving component comprises a rotating motor or a manual rotating part, the first driving component is located outside the vacuum cavity, one of the first cover body and the second cover body is provided with an installation through hole, and one end of the rotating shaft is connected with the first driving component after passing through the installation through hole.

9. The heat-insulation device of claim 7, further comprising a second driving component, wherein the second driving component is capable of driving the heat-conducting element to move.

10. The heat-insulation device of claim 9, wherein the second driving component comprises a linear motor, and the linear motor is located outside the vacuum cavity, one of the first cover body and the second cover body is provided with an installation through hole, and the linear motor is connected with the heat-conducting element through the installation through hole; or, the second driving component comprises a manual toggle part, wherein one of the first cover body and the second cover body is provided with an installation through hole, one end of the manual toggle part is located outside the vacuum cavity, and the other end of the manual toggle part is connected with the heat-conducting element through the installation through hole.

11. The heat-insulation device of claim 1, wherein the second cover body is provided with a groove, and the groove is configured to accommodate the heat-sensitive device.

12. The heat-insulation device of claim 1, wherein a plurality of heat-conducting elements are provided, and the plurality of heat-conducting elements are arranged at intervals.

13. The heat-insulation device of claim 1, wherein the heat-conducting element is integrated with the first cover body;
or, the heat-conducting element is integrated with the second cover body.

14. The heat-insulation device of claim 1, wherein the second cover body is made of a heat-insulation material or a heat-conducting material.

15. An electronic product, comprising: a heating element; and
a heat-insulation device, being of a closed hollow structure, and comprising a first cover body and a second cover body arranged opposite to each other; wherein: a vacuum cavity is formed in the heat-insulation device; the first cover body is made of a heat-conducting material; and a heat-conducting element is provided in the vacuum cavity, and a first end of the heat-conducting element is in contact with an inner wall surface of the first cover body, the heat-conducting element is movably arranged in the vacuum cavity;
wherein the heating element is arranged close to the first cover body of the heat-insulation device.

16. The electronic product of claim 15, further comprising a heat-sensitive device, wherein the heat-sensitive device is arranged close to the second cover body of the heat-insulation device.

17. The electronic product of claim 16, wherein a plurality of heating elements are provided, the plurality of the heating elements are arranged around the first cover body, and the heat-sensitive device is accommodated in a groove of the second cover body.

18. The electronic product of claim 16, wherein a plurality of heat-sensitive devices and a plurality of heat-insulation devices are provided, each of the heat-sensitive devices is accommodated in one groove of the second cover body, the plurality of heat-insulation devices are sequentially arranged, and at least a part of one of two adjacent heat-insulation devices is accommodated in a groove of the other heat-insulation device.

19. The electronic product of claim 15, wherein the second cover body of the heat-insulation device constitutes a part of a shell of the electronic product.

* * * * *